(12) United States Patent
Riordon et al.

(10) Patent No.: US 11,715,662 B2
(45) Date of Patent: Aug. 1, 2023

(54) ACTIVELY CLAMPED CARRIER ASSEMBLY FOR PROCESSING TOOLS

(71) Applicant: Applied Materials, Inc., Santa Clara, CA (US)

(72) Inventors: Benjamin B. Riordon, Newburyport, MA (US); James D. Strassner, Austin, TX (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 208 days.

(21) Appl. No.: 17/119,382

(22) Filed: Dec. 11, 2020

(65) Prior Publication Data

US 2022/0189815 A1    Jun. 16, 2022

(51) Int. Cl.
| | |
|---|---|
| *H01L 21/683* | (2006.01) |
| *C23C 16/458* | (2006.01) |
| *C23C 16/04* | (2006.01) |
| *H01L 21/687* | (2006.01) |
| *H01L 21/02* | (2006.01) |
| *B05C 21/00* | (2006.01) |
| *C23C 14/04* | (2006.01) |

(52) U.S. Cl.
CPC ........ *H01L 21/6838* (2013.01); *B05C 21/005* (2013.01); *C23C 14/042* (2013.01); *C23C 16/042* (2013.01); *C23C 16/4585* (2013.01); *H01L 21/02266* (2013.01); *H01L 21/68721* (2013.01)

(58) Field of Classification Search
None
See application file for complete search history.

(56) References Cited

U.S. PATENT DOCUMENTS

| | | | | |
|---|---|---|---|---|
| 4,511,599 A | * | 4/1985 | Rustomji | ............... C23C 14/042 445/24 |
| 4,746,548 A | * | 5/1988 | Boudreau | ............. C23C 14/042 118/721 |
| 4,915,057 A | * | 4/1990 | Boudreau | ............. C23C 16/042 118/721 |

(Continued)

FOREIGN PATENT DOCUMENTS

| | | |
|---|---|---|
| WO | 2019-091574 A1 | 5/2019 |
| WO | 2020139626 A1 | 7/2020 |

OTHER PUBLICATIONS

PCT Notification of Transmittal of the International Search Report and the Written Opinion of the International Searching Authority for International Application No. PCT/US2021/016404; dated Mar. 29, 2022.

*Primary Examiner* — Jethro M. Pence
(74) *Attorney, Agent, or Firm* — Patterson + Sheridan, LLP

(57) ABSTRACT

Embodiments of the present disclosure are related to carrier assemblies that can clamp more than one optical device substrates and methods for forming the carrier assemblies. The carrier assembly includes a carrier, one or more substrates, and a mask. The carrier is magnetically coupled to the mask to retain the one or more substrates. The carrier assembly is used for supporting and transporting the one or more substrates during processing. The carrier assembly is also used for masking the one or more substrates during PVD processing. Methods for assembling the carrier assembly in a build chamber are described herein.

7 Claims, 9 Drawing Sheets

(56) References Cited

U.S. PATENT DOCUMENTS

| | | | | |
|---|---|---|---|---|
| 6,749,690 B2* | 6/2004 | Clark | H01L 21/682 |
| | | | 118/721 |
| 8,048,228 B2* | 11/2011 | Kuwajima | H01G 2/065 |
| | | | 156/345.55 |
| 8,328,944 B2* | 12/2012 | Eida | C23C 14/50 |
| | | | 118/721 |
| 8,686,819 B2 | 4/2014 | Schuessler et al. | |
| 9,000,455 B2* | 4/2015 | Lee | H01L 21/68721 |
| | | | 216/12 |
| 9,082,799 B2* | 7/2015 | Weaver | H01L 21/68778 |
| 9,325,007 B2 | 4/2016 | Kwak et al. | |
| 9,490,153 B2* | 11/2016 | Webb | H01L 21/682 |
| 9,525,099 B2* | 12/2016 | Bluck | C23C 14/042 |
| 2002/0093080 A1 | 7/2002 | Kay | |
| 2013/0048608 A1* | 2/2013 | Pasqualin | H01L 21/68785 |
| | | | 427/256 |
| 2013/0276978 A1 | 10/2013 | Bluck et al. | |
| 2014/0170783 A1 | 6/2014 | Webb et al. | |
| 2015/0284839 A1* | 10/2015 | Sugimoto | C23C 14/34 |
| | | | 118/504 |
| 2016/0043319 A1* | 2/2016 | White | C23C 14/042 |
| | | | 359/230 |
| 2019/0088531 A1 | 3/2019 | Sarode Vishwanath et al. | |
| 2019/0211442 A1 | 7/2019 | Lerner et al. | |

* cited by examiner

ACTIVELY CLAMPED CARRIER ASSEMBLY FOR PROCESSING TOOLS

BACKGROUND

Field

Embodiments of the present disclosure generally relate to carrier assemblies. More specifically, embodiments described herein provide for carrier assemblies that clamp more than one optical device substrate and methods for forming the carrier assemblies.

Description of the Related Art

Optical devices may be used to manipulate the propagation of light by spatially varying structural parameters (e.g., shape, size, orientation) of structures of the optical devices formed on a substrate. The optical devices provide a spatially varying optical response that molds optical wavefronts as desired. These structures of the optical devices alter light propagation by inducing localized phase discontinuities (i.e., abrupt changes of phase over a distance smaller than the wavelength of the light). These structures may be composed of different types of materials, shapes, or configurations on the substrate and may operate based upon different physical principles.

Fabricating optical devices requires depositing and patterning device material disposed on one or more substrates. However, it is desirable for the one or more substrates to be clamped such that the one or more substrates are aligned and in positon during the processing steps. Additionally, it is desirable to have an assembly that can clamp more than one optical device substrate during processing. Accordingly, what is needed in the art are carrier assemblies that clamp more than one optical device substrate and methods for forming the carrier assemblies.

SUMMARY

In one embodiment, a carrier assembly is provided. The carrier assembly includes a mask. The mask includes a pattern of openings disposed through the mask. The mask includes pinholes. The carrier assembly further includes a carrier. The carrier includes a magnet disposed in the carrier. The magnet is magnetically coupled to the mask. The carrier assembly further includes a plurality of pockets recessed into the carrier. Each pocket of the plurality of pockets has a width corresponding to a substrate to be disposed therein. The carrier assembly further includes alignment pins disposed in the carrier and disposed through the pinholes in the mask. The alignment pins are adjacent to a sidewall of the plurality of pockets.

In another embodiment, a carrier assembly is provided. The carrier assembly includes a mask. The mask includes a pattern of openings disposed through the mask. The mask includes pinholes. The carrier assembly further includes a carrier. The carrier includes a magnet disposed in the carrier. The magnet is magnetically coupled to the mask. The carrier assembly further includes a plurality of lips such that a distance between adjacent lips of the plurality of lips corresponds to a substrate to be disposed on the adjacent lips of the plurality of lips. The carrier assembly further includes a plurality of pins disposed through the plurality of lips. The plurality of pins are operable to surround the substrate disposed on the plurality of lips. The carrier assembly further includes alignment pins disposed in the carrier and disposed through the pinholes in the mask. The alignment pins are disposed through the plurality of lips.

In yet another embodiment, a method is provided. The method includes inserting a carrier having a mask thereon into a build chamber. The carrier is chucked to a lower vacuum chuck in the build chamber. The method further includes lifting the lower vacuum chuck. The mask is in contact with an upper vacuum chuck in the build chamber. The method further includes lowering the lower vacuum chuck. The mask is chucked to the upper vacuum chuck. The method further includes inserting one or more substrates to be in contact with one or more substrate chucks. The one or more substrates are chucked to the one or more substrate chucks. The method further includes lifting the lower vacuum chuck. The carrier is magnetically coupled with the mask. The method further includes lowering the lower vacuum chuck. The mask is released from the upper vacuum chuck and the one or more substrates are released from the one or more substrate chucks to form a carrier assembly.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to carrier assemblies. More specifically, embodiments described herein provide for carrier assemblies that clamp more than one optical device substrate and methods for forming the carrier assemblies. The method includes inserting a carrier having a mask thereon into a build chamber.

The carrier is chucked to a lower vacuum chuck in the build chamber. The method further includes lifting the lower vacuum chuck. The mask is in contact with an upper vacuum chuck in the build chamber. The method further includes lowering the lower vacuum chuck. The mask is chucked to the upper vacuum chuck. The method further includes inserting one or more substrates to be in contact with one or more substrate chucks. The one or more substrates are chucked to the one or more substrate chucks. The method further includes lifting the lower vacuum chuck. The carrier is magnetically coupled with the mask. The method further includes lowering the lower vacuum chuck. The mask is released from the upper vacuum chuck and the one or more substrates are released from the one or more substrate chucks to form a carrier assembly.

Figure 1A:
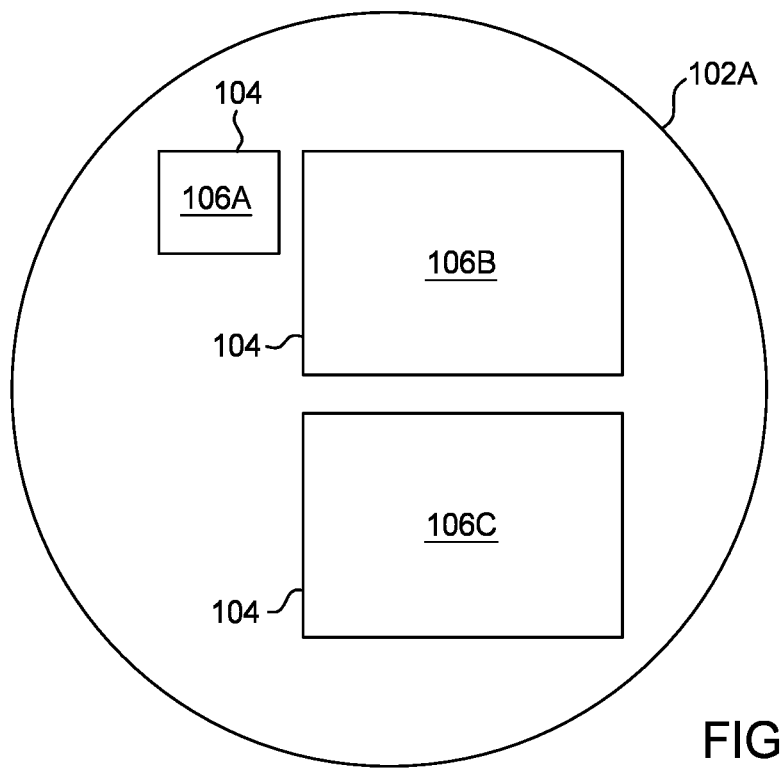
FIGS. 1A and 1B are perspective, top views of a substrate according to an embodiment.
Figure 1B:
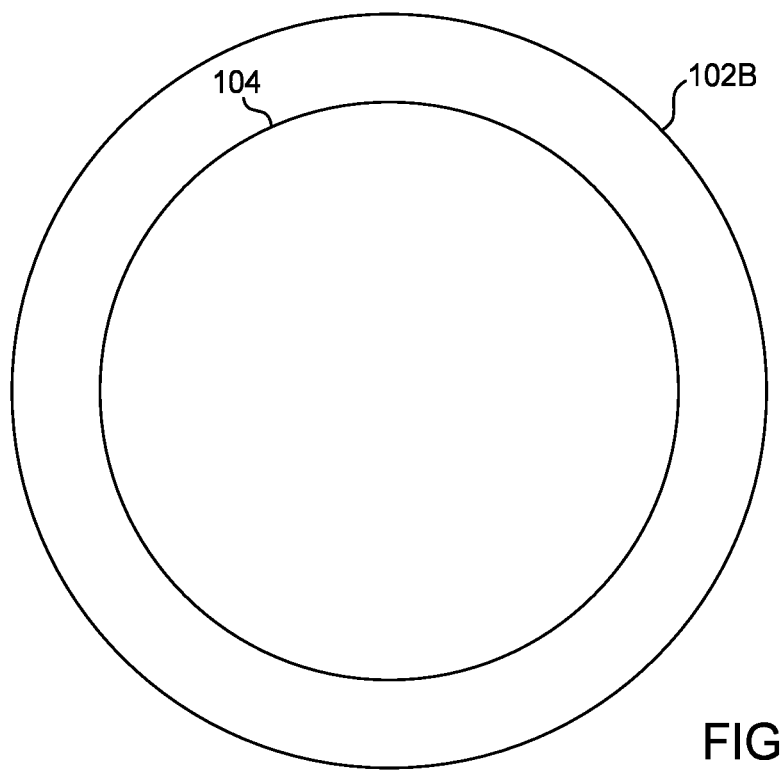

FIG. 1A illustrates a perspective, top view of a substrate 102A, according to one embodiment. FIG. 1B illustrates a perspective, top view of a substrate 102B, according to another embodiment. It is to be understood that the substrates 102A and 102B described below are exemplary optical devices. FIGS. 1A and 1B illustrate the substrates 102A and 102B where a device material 104 has been deposited. The substrates 102 shown in FIG. 3A-3D depict the substrate 102A or substrate 102B before deposition of the device material 104.

In one embodiment, which can be combined with other embodiments described herein, the substrate 102A is utilized to create a waveguide combiner, such as an augmented reality waveguide combiner. The substrate 102A includes a device material 104 disposed on the substrate 102A. In one embodiment, which can be combined with other embodiments described herein, the device material 104 can be patterned to form optical device structures. In another embodiment, which can be combined with other embodiments described herein, the device material 104 can include optical device structures. For example, as shown in FIG. 1A, the device material 104 can be patterned to correspond to one or more regions that correspond to gratings when optical device structures are formed in the device material 104, such as a first region 106a, a second region 106b, and a third region 106c. In one embodiment, which can be combined with other embodiments described herein, the substrate 102A is utilized to create a waveguide combiner that includes at least the first region 106a corresponding to an input coupling grating and the third region 106c corresponding to an output coupling grating. The waveguide combiner according to the embodiment, which can be combined with other embodiments described herein, may include the second region 106b corresponding to an intermediate grating.

In one embodiment, which can be combined with other embodiments described herein, the substrate 102B is utilized to create a flat optical device, such as a metasurface. The substrate 102B includes the device material 104 disposed on the substrate 102B. In one embodiment, which can be combined with other embodiments described herein, the device material 104 can be patterned to form optical device structures. In another embodiment, which can be combined with other embodiments described herein, the device material 104 can include optical device structures.

Figure 2A:
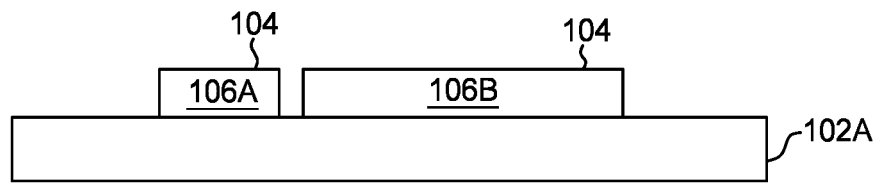
FIGS. 2A and 2B are perspective, side views of a substrate according to an embodiment.
Figure 2B:
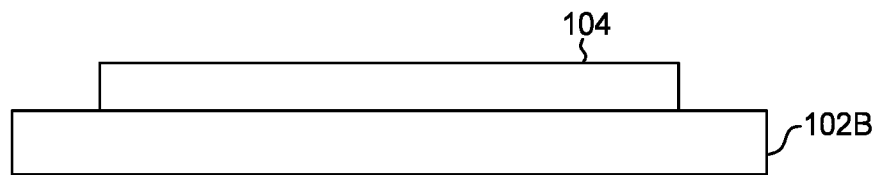

FIGS. 2A and 2B illustrate a perspective, side view of the substrates 102A and 102B. FIGS. 2A and 2B illustrate the substrates 102A and 102B where a device material 104 has been deposited. The substrate 102A, as shown in FIG. 2A, corresponds to the substrate 102A of FIG. 1A. The substrate 102B, as shown in FIG. 2B, corresponds to the substrate 102B of FIG. 1B. The substrates 102A and 102B may also be selected to transmit a suitable amount of light of a desired wavelength or wavelength range, such as one or more wavelengths in the infrared region to UV region (i.e., from about 700 to about 1400 nanometers). Without limitation, in some embodiments, the substrates 102 are configured such that the substrates 102 transmit greater than or equal to about 50%, 60%, 70%, 80%, 90%, 95%, 99%, to UV region of the light spectrum. The substrates 102 may be formed from any suitable material, provided that the substrates 102 can adequately transmit light in a desired wavelength or wavelength range and can serve as an adequate support for the optical devices. In some embodiments, which can be combined with other embodiments described herein, the material of the substrates 102A and 102B have a refractive index that is relatively low, as compared to the refractive index of the device material 104.

Substrate selection may include substrates 102A and 102B of any suitable material, including, but not limited to, amorphous dielectrics, crystalline dielectrics, silicon oxide, silicon carbide, polymers, and combinations thereof. In some embodiments, which can be combined with other embodiments described herein, the substrates 102 include a transparent material. In one embodiment, which can be combined with other embodiments described herein, the substrates 102A and 102B are transparent with absorption coefficient smaller than 0.001. Suitable examples may include an oxide, sulfide, phosphide, telluride or combinations thereof. Additionally, substrate selection may further include substrates 102A and 102B of varying shapes, thickness, and diameter. For example, the substrate 102A and 102B may have a diameter of about 150 mm to about 300 mm. The substrate 102A and 102b can have a circular, rectangular, or square shape.

The substrate 102A and 102B include the device material 104 disposed thereon. Disposing the device material 104 on the substrate 102A and 102b can include, but is not limited to, one or more of a liquid material pour casting process, a spin-on coating process, a liquid spray coating process, a dry powder coating process, a screen printing process, a doctor blading process, a physical vapor deposition (PVD) process, a chemical vapor deposition (CVD) process, a plasma-enhanced (PECVD) process, a flowable CVD (FCVD) process, and an atomic layer deposition (ALD) process. In another embodiment, which can be combined with other embodiments described herein, the device layer 104 includes, but is not limited to, titanium dioxide ($TiO_2$), zinc oxide (ZnO), tin dioxide ($SnO_2$), aluminum-doped zinc oxide (AZO), fluorine-doped tin oxide (FTO), cadmium stannate (tin oxide) (CTO), and zinc stannate (tin oxide) ($SnZnO_3$), silicon nitride ($Si_3N_4$), and amorphous silicon (a-Si) containing materials.

Figure 3A:
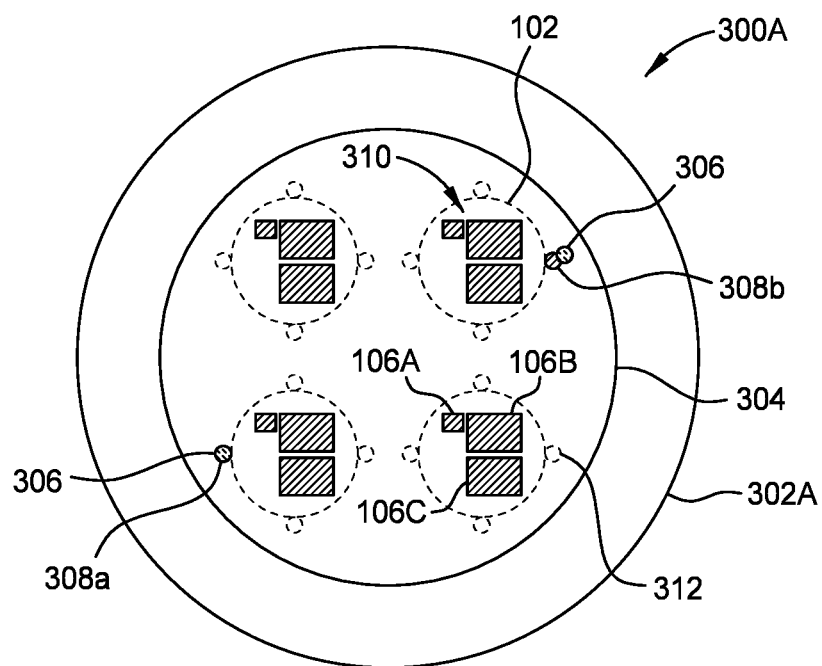
FIG. 3A is a schematic, top view of a carrier assembly according to an embodiment.
Figure 3B:
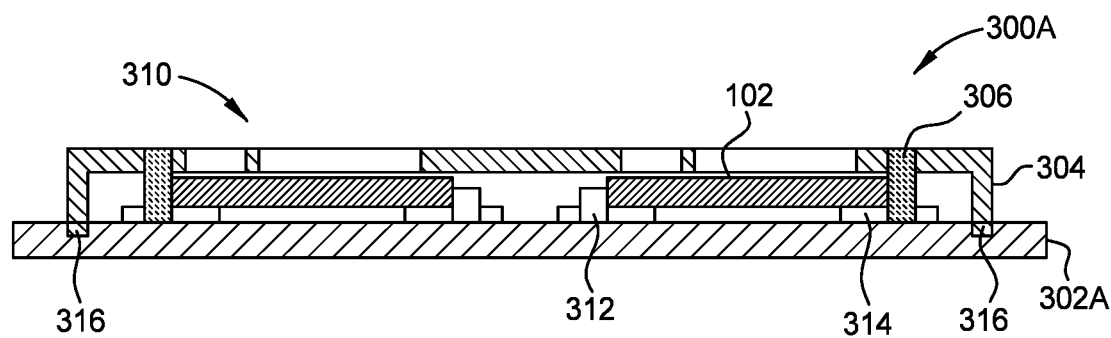
FIG. 3B is a schematic, cross-sectional view of a carrier assembly according to an embodiment.

FIG. 3A is a schematic, top view of a carrier assembly 300A. FIG. 3B is a schematic, cross-sectional view of the carrier assembly 300A. The carrier assembly 300A includes a carrier 302A, one or more substrates 102, and a mask 304. The carrier assembly 300A is used for supporting and transporting the one or more substrates 102A during processing. The carrier assembly 300A is also used for masking the one or more substrates 102 during PVD processing. For example, the carrier assembly 300A can be positioned vertically and mask the one or more substrates 102 during PVD processing. Additionally, the carrier assembly 300A is used for processes, such as etch processes, utilizing a vertical scan of the carrier assembly 300A. In one embodiment, which can be combined with other embodiments described herein, the etch process is a plasma assisted etch process. In the plasma assisted etch process the carrier assembly 300A is scanned vertically such that the one or more substrates 102 are perpendicular to the plasma source. The carrier assembly 300A is also used for patterning processes. For example, a patterning process that requires movement of the one or more substrates 102 can utilize the carrier assembly 300A.

The carrier 302A supports the substrate 102 on the outer edges of the substrate as to not damage the backside of the substrate 102. In one embodiment, which can be combined with other embodiments described herein, the carrier assembly 300A is positioned horizontally during processing. In another embodiment, which can be combined with other embodiments described herein, the carrier assembly 300A is positioned vertically during processing. The carrier 302A includes, but is not limited to a silicon material. The mask 304 includes a stainless steel material or a non-ferrous material. For example, the stainless steel material can be 430 stainless steel. The non-ferrous material may include glass or silicon. In one embodiment, which can be combined with other embodiments described herein, a non-ferrous mask 304 is bonded to a ferrous strike plate. The ferrous strike plate is disposed between the non-ferrous mask 304 and a magnet 316 disposed in the carrier 302A.

The mask 304 is aligned with the carrier 302A with alignment pins 306. In one embodiment, which can be combined with other embodiments described herein, the alignment pins 306 are disposed in the carrier 302A and extend through pin holes 308. In another embodiment, which can be combined with other embodiments described herein, alignment pins 306 are disposed in the mask 304 and extend through the carrier 302A. The alignment pins 306 run through the pinholes 308 such that the mask 304 is positioned above the one or more substrates 102. In yet another embodiment, which can be combined with other embodiments described herein, a first pinhole 308a is tightly positioned around the circumference of the alignment pin 306 and a second pinhole 308b is disposed opposite the first pinhole and is a slot. The second pinhole 308b allows for adjustment of the position of the mask 304 when aligning with the carrier 302.

The magnet 316 is permanent and disposed in the carrier 302A. The magnet 316 is operable to magnetically couple the carrier 302A to the mask 304. The magnetic coupling between the mask 304 and the carrier 302A allows for the mask 304 and the carrier 302A to remain coupled during processing and prevent the one or more substrates 102 from moving during processing. In one embodiment, which can be combined with other embodiments described herein, the mask 304 is made of a magnetic material, such as a ferromagnetic or ferromagnetic material, to magnetically couple to the magnet 316 in the carrier 302A. Examples of the magnetic material include cobalt alloys of iron or nickel. In another embodiment, which can be combined with other embodiments described herein, the mask 304 includes a separate magnet to magnetically couple to the magnet 316 in the carrier 302A.

The one or more substrates 102 are retained on the carrier 302A. The one or more substrates 102 are disposed between the carrier 302A and the mask 304. In one embodiment, which can be combined with other embodiments described herein, the one or more substrates are retained on the carrier 302A with a plurality of pins 312, as shown in FIG. 3A. The plurality of pins 312 surround the perimeter of the one or more substrates 102 such that the one or more substrates 102 are retained in place. The plurality of pins 312 are disposed through the carrier 302A. In another embodiment, which can be combined with other embodiments described herein, the alignment pin 306 can act as a one of the plurality of pins 312. In embodiments where the carrier assembly 300A is positioned vertically, the one or more substrates 102 are prevented from being displaced by the plurality of pins 312. Any number, size, or shape of substrates 102 can be retained on the carrier 302A for processing. The plurality of pins 312 will be positioned in the carrier 302A depending on the configuration of the one or more substrates 102.

As shown in FIG. 3B, the carrier 302A includes a plurality of lips 314. The plurality of lips 314 are disposed on the carrier 302A and each substrate 102 of the one or more substrates 102 are disposed on the plurality of lips 314. The plurality of lips 314 position the one or more substrates 102 above the carrier 302A such that the backside of the one or more substrates 102 are not damaged during processing. The plurality of pins 312 are disposed through the carrier 302A and the plurality of lips 314.

The mask 304 includes a pattern of openings 310 disposed through the mask 304. The pattern of openings 310 are disposed above the one or more substrates 102. The one or more substrates 102 are to be selectively exposed to a processing condition such as a deposition process or an etch process based on the pattern of openings 310. The pattern of openings 310 allow for the device material 104 to be disposed through the pattern of openings 310 to form the desired pattern on the substrate 102. The alignment pins 306 and the plurality of pins 312 align the mask 304 and the one or more substrates 102 in a specific orientation such that the device material 104 can be disposed on the one or more substrates 102 through the pattern of openings 310.

In one embodiment, which can be combined with other embodiments described herein, the pattern of openings 310 correspond to the first region 106a, the second region 106b, and the third region 106c, as shown in FIG. 1A. In another embodiment, which can be combined with other embodiments described herein, the mask 304 can be a clamp ring i.e., the mask 304 includes a single opening disposed through the center of the mask 304. The clamp ring can be utilized for an open etching process. In yet another embodiment, which can be combined with other embodiments described herein, the clamp ring corresponds to the pattern of the device material 104, as shown in FIG. 1B.

Figure 3C:
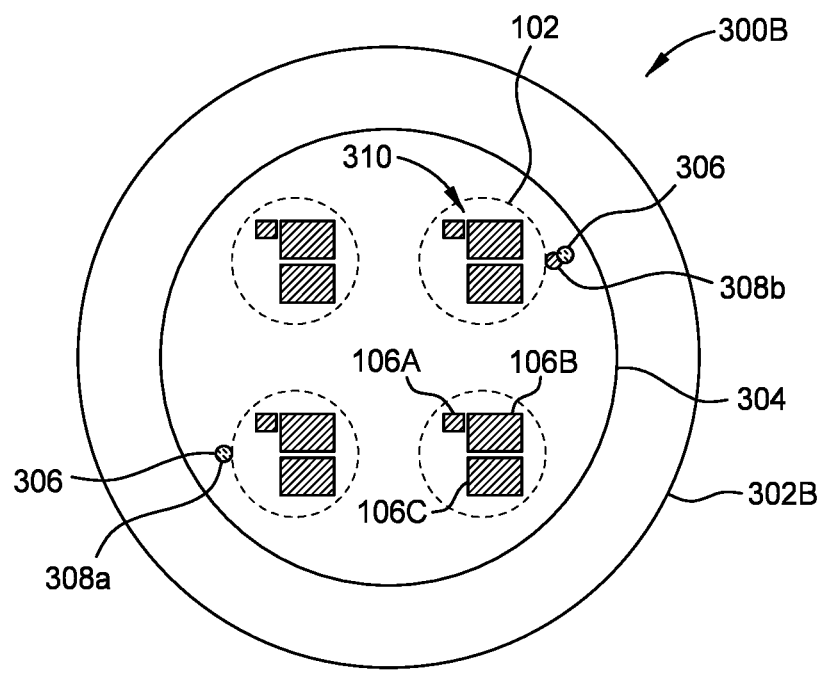
FIG. 3C is a schematic, top view of a carrier assembly according to an embodiment.
Figure 3D:
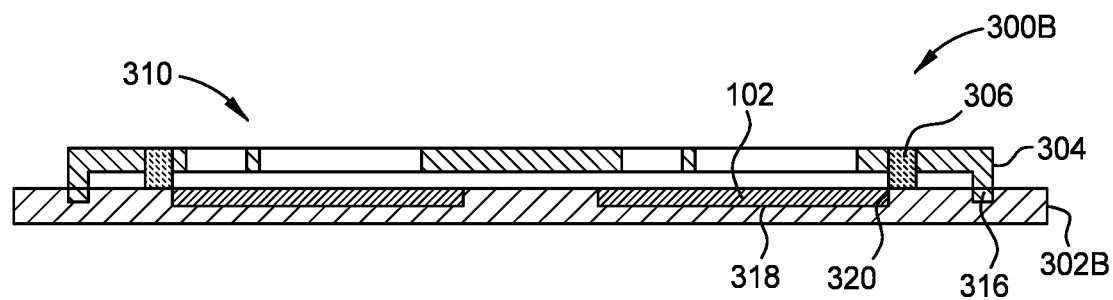
FIG. 3D is a schematic, cross-sectional view of a carrier assembly according to an embodiment.

FIG. 3C is a schematic, top view of a carrier assembly 300B. FIG. 3D shows the carrier assembly 300B including the plurality of pockets 318. The carrier assembly 300B includes a carrier 302B, one or more substrates 102, and a mask 304. The carrier assembly 300B is used for supporting and transporting the one or more substrates 102 during processing. The carrier assembly 300B is also used for masking the one or more substrates 102 during PVD processing. For example, the carrier assembly 300B can be positioned vertically and mask the one or more substrates 102 during PVD processing. Additionally, the carrier assembly 300B is used for processes, such as etch processes, utilizing a vertical scan of the carrier assembly 300B. In one embodiment, which can be combined with other embodiments described herein, the etch process is a plasma assisted etch process. In the plasma assisted etch process the carrier assembly 300B is scanned vertically such that the one or more substrates 102 are perpendicular to the plasma source. The carrier assembly 300B is also used for patterning processes. For example, a patterning process that requires movement of the one or more substrates 102 can utilize the carrier assembly 300B.

The carrier 302B supports the substrate 102 on the outer edges of the substrate as to not damage the backside of the substrate 102. In one embodiment, which can be combined with other embodiments described herein, the carrier assembly 300B is positioned horizontally during processing. In another embodiment, which can be combined with other embodiments described herein, the carrier assembly 300B is positioned vertically during processing. The carrier 302B includes, but is not limited to a silicon material. The mask 304 includes a stainless steel material or a non-ferrous material. For example, the stainless steel material can be 430 stainless steel. The non-ferrous material may include glass or silicon. In one embodiment, which can be combined with other embodiments described herein, a non-ferrous mask 304 is bonded to a ferrous strike plate. The ferrous strike plate is disposed between the non-ferrous mask 304 and a magnet 316 disposed in the carrier 302B.

The mask 304 is aligned with the carrier 302B with alignment pins 306. The alignment pins 306 run through pinholes 308 such that the mask 304 is positioned above the one or more substrates 102. In yet another embodiment, which can be combined with other embodiments described herein, a first pinhole 308a is tightly positioned around the circumference of the alignment pin 306 and a second pinhole 308b is disposed opposite the first pinhole and is a slot.

The carrier 302B further includes a magnet 316. The magnet 316 is permanent and disposed in the carrier 302B. The magnet 316 is operable to magnetically couple the carrier 302B to the mask 304. The magnetic coupling between the mask 304 and the carrier 302B allows for the mask 304 and the carrier 302B to remain coupled during processing and prevent the one or more substrates 102 from moving during processing.

The one or more substrates 102 are retained on the carrier 302B. The one or more substrates 102 are disposed between the carrier 302B and the mask 304. The carrier 302B includes a plurality of pockets 318. The plurality of pockets 318 are recessed into the carrier 302. The one or more substrates 102 are disposed in the plurality of pockets 318. The one or more substrates 102 abut sidewalls 320 of the plurality of pockets 318. The sidewalls 320 retain the one or more substrates 102 in positon during processing. Any number, size, or shape of substrates 102 can be retained on the carrier 302B for processing.

The mask 304 includes a pattern of openings 310 disposed through the mask 304. The pattern of openings 310 are disposed above the one or more substrates 102. The one or more substrates 102 are to be selectively exposed to a processing condition such as a deposition process or an etch process based on the pattern of openings 310. The pattern of openings 310 allow for the device material 104 to be disposed through the pattern of openings 310 to form the desired pattern on the substrate 102. The alignment pins 306 and the plurality of pockets 318 align the mask 304 and the one or more substrates 102 in a specific orientation such that the device material 104 can be disposed on the one or more substrates 102 through the pattern of openings 310.

Figure 4:
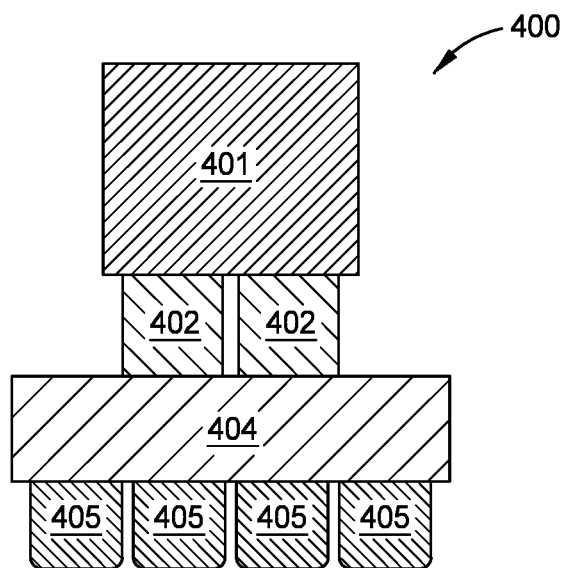
FIG. 4 is a schematic view of a processing system according to an embodiment.

FIG. 4 is a schematic view of a processing system 400. The processing system 400 includes a transfer chamber 401 coupled to a load lock 402. It is to be understood that while two load locks 402 are shown in FIG. 4, it is contemplated that a single load lock 402 may be used or more than two load locks 402 may be used. Thus, the embodiments discussed herein are not to be limited to two load locks 402. Load locks 402 are coupled to factory interface 404. Load port stations 405 are coupled to the factory interface 404. In one embodiment, as pictured in FIG. 4, four load port stations 405 are present. It is to be understood that while four load port stations 405 are shown in FIG. 4, it is contemplated that any number of load port stations 405 may be used. Thus, the embodiments discussed herein are not to be limited to four load port stations 405. In one embodiment, the process system 400 may be an etch process chamber. In another embodiment, the process system 400 may be a PVD process chamber. The load port stations 405 will contain one or more carrier assemblies 300A or 300B. The carrier assemblies 300 will be assembled at a location separate from the load portion stations 405 and the factory interface 404.

The carrier assemblies 300A and 300B will be assembled in a build station 515. Build station 515 is used to build and unbuild one or more carrier assemblies 300A and 300B in an automated form. Building a carrier assembly 300 automatically is more efficient, both timely and costly, and prevents potential particle damage or breakage. Building a carrier assembly 300A or 300B automatically also produces a higher quality product than if the carrier assembly 300A and 300B were to be built manually.

Figure 5:
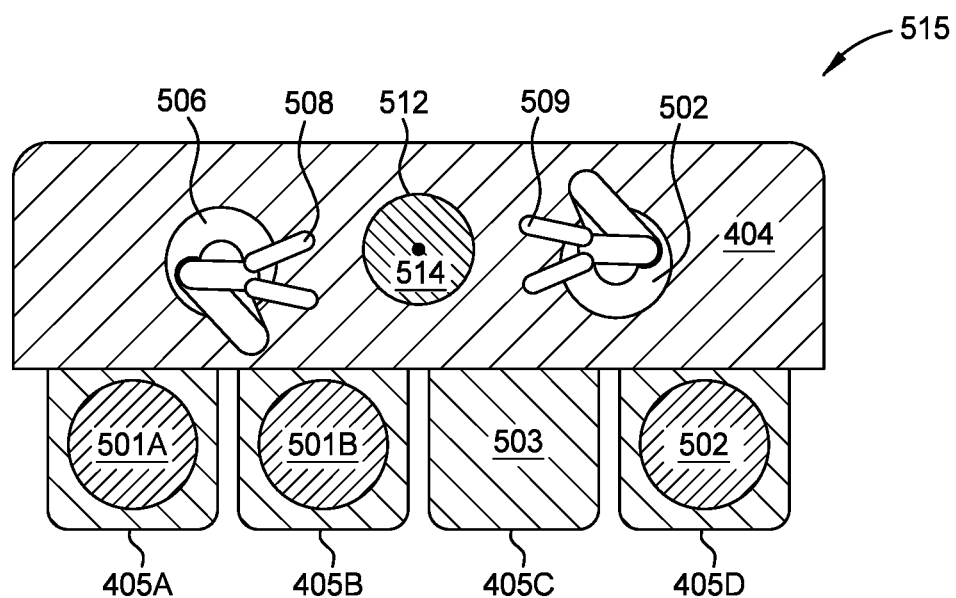
FIG. 5 is a detailed schematic view of a build station according to an embodiment.

FIG. 5 is a detailed schematic view of the build station 515. The build station 515 is utilized to assemble the carrier assembly 300A and 300B. The offline build station 515 has factory interface 404 and load port stations 405A-405D. Front opening unified pods (FOUPs) 501A and 501B are located at load port stations 405A and 405B, respectively. Substrate FOUP 502 is located at load port station 405D. A flip device 503 is located at load port station 405C. Two actuators 506 and 507 are disposed within the factory interface 404. In one embodiment, the actuator 506 is a 300 mm Selective Compliance Assembly Robot Arm (SCARA) Robot. In one embodiment, the actuator 507 is a 200 mm SCARA Robot. Actuators 506 and 507 are independent of one another. The actuators 506 and 507 have actuator arms 508 and 509. The actuator arms 508 and 509 enable the actuators 506 and 507 to receive and transport the components of carrier assembly 300A and 300B. An aligner is positioned at an aligner station 512 between actuators 506 and 507 in the factory interface 404. A build chamber 700 is disposed above the aligner 512.

FOUP 501 is loaded with the carriers 302A or 302B and the masks 304. FOUP 501 is a 300 mm FOUP. A generic FOUP is a cassette with twenty-five slots. Substrate FOUP 502 is loaded with the one or more substrates 102. In one embodiment, the substrate FOUP 502 is a 300 mm substrate FOUP. In another embodiment, the substrate FOUP 502 is a 200 mm substrate FOUP. In one embodiment, which can be combined with other embodiments described herein, the FOUP 501A includes the carrier 302A or 302B and the mask 304 while the FOUP 501B includes one or more of the carrier assembly 300A or 300B. In another embodiment, which can be combined with other embodiments described herein, the FOUP 501A includes one or more of the carrier assembly 300A or 300B while the FOUP 501B includes the carrier assembly 300A or 300B after the one or more substrates 102 are flipped.

An aligner station 512 is utilized to orient the mask 304, the one or more substrates 102, and the carrier 302A or 302B in the XY direction. The aligner station 512 is capable of rotating 360 degrees. The aligner station 512 rotates the mask 304, the one or more substrates 102, or the carrier 302A or 302B to find the center 514 of the mask 301, substrate 201, and the carrier 302A or 302B. The aligner station 512 is able to locate the center 514 of the mask 304, the one or more substrates 102, or the carrier 302A or 302B with accuracy of about 0.001 in. In one embodiment, which can be combined with other embodiments described herein, the aligner station 512 includes a vacuum chuck.

Figure 6:
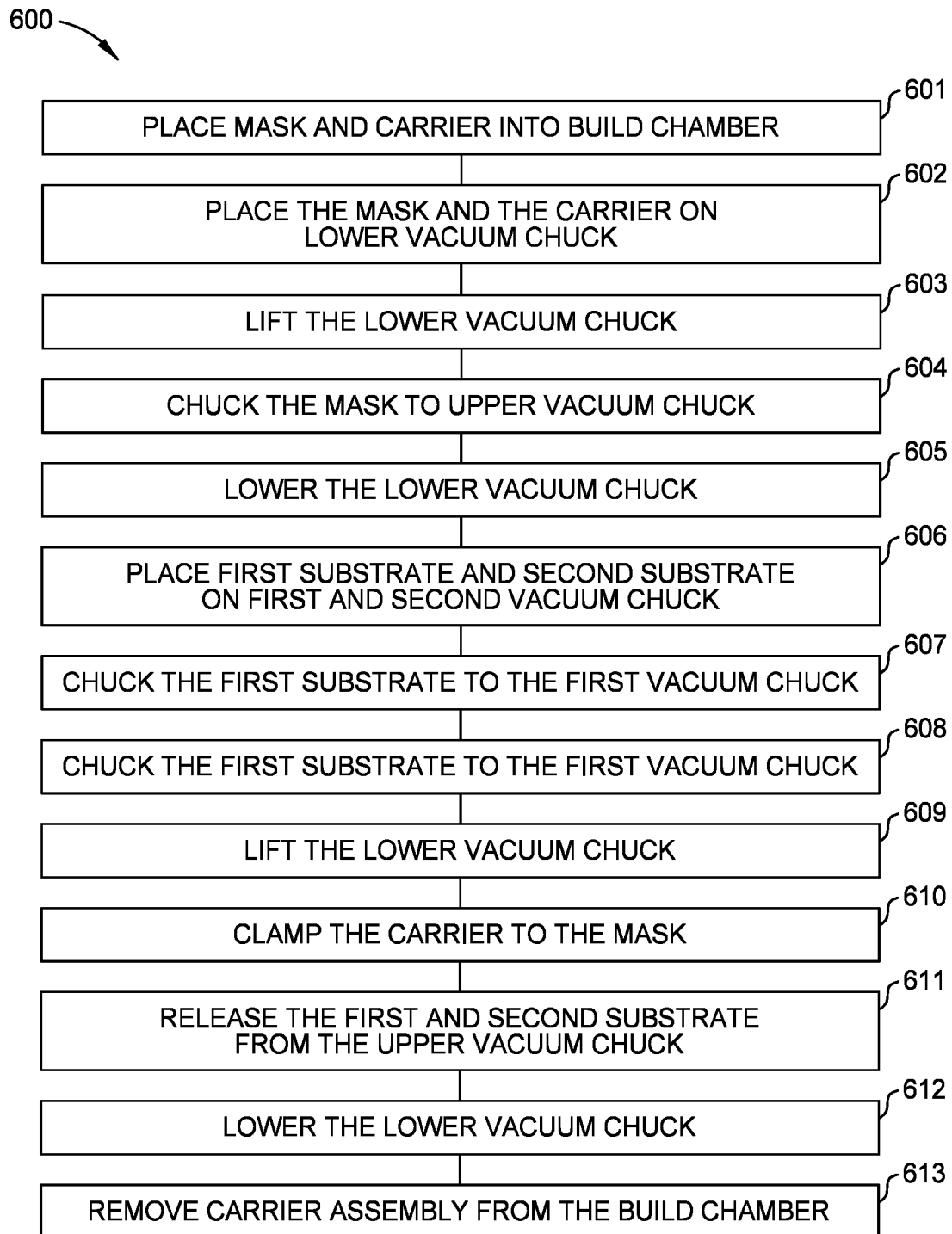
FIG. 6 is a flow diagram of a method for building a carrier assembly according to an embodiment.
Figure 7A:
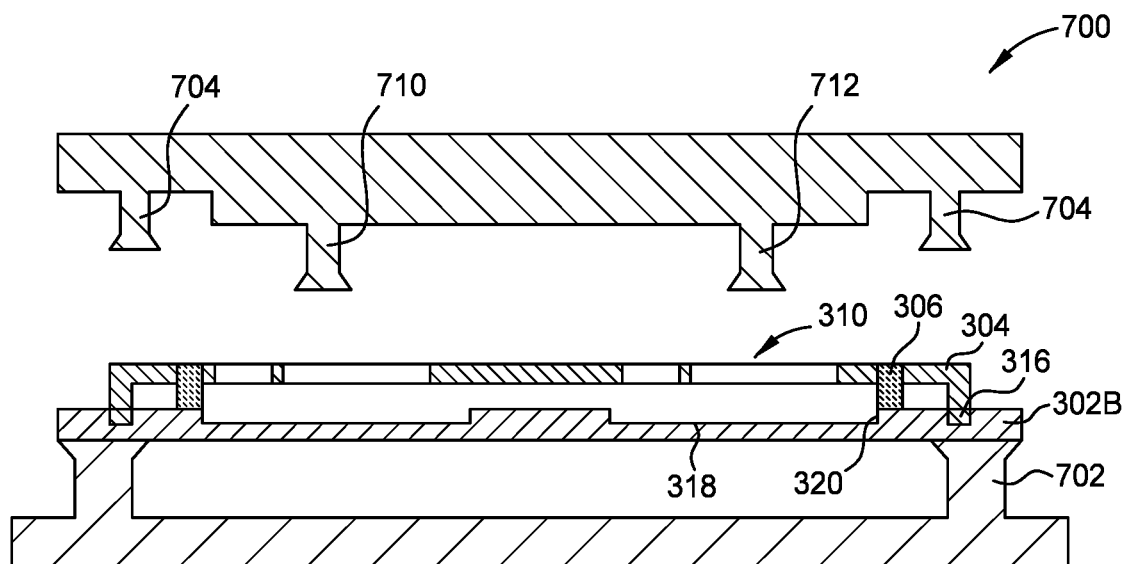
FIGS. 7A-7F show a schematic cross-sectional view of a build chamber utilized to perform a method according to an embodiment.

FIG. 6 is a flow diagram of a method 600 for building a carrier assembly 300A or 300B. FIGS. 7A-7F show a schematic, cross-sectional view of a build chamber 700 utilized to perform the method 600. Although FIGS. 7A-7F depict the carrier assembly 300B, the carrier assembly 300A can be built with the method 600. Although FIGS. 7A-7F depict the carrier 302B, the carrier 302A can be used in the method 600. At operation 601, as shown in FIG. 7A, the actuator arms 508 place a mask 304 and a carrier 302B into the build chamber 700. Prior to entering the build chamber 700, the mask 304 and the carrier 302B are removed from FOUP 501A by the actuator arms 508. The actuator arms 508 transfer the mask 304 and the carrier 302B to an aligner station 512. The aligner station 512 finds the center 514 of the mask 304 and the carrier 302B and aligns the mask 304 and the carrier 302B prior to entering the build chamber 700. The actuator arms 508 remove the mask 304 and the carrier 302B from the aligner station 512. At operation 602, the actuator arms 508 place the mask 304 and the carrier 302B on a lower vacuum chuck 702 in the build chamber 700. Power is applied to the lower vacuum chuck 702 to chuck the carrier 302B to the lower vacuum chuck 702. The actuator arms 508 retract from the build chamber 700.

Figure 7B:
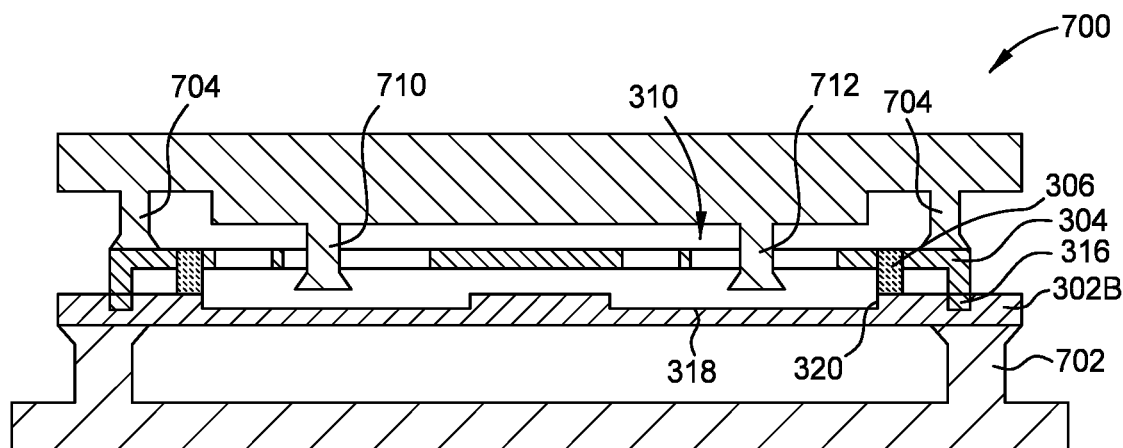
Figure 7C:
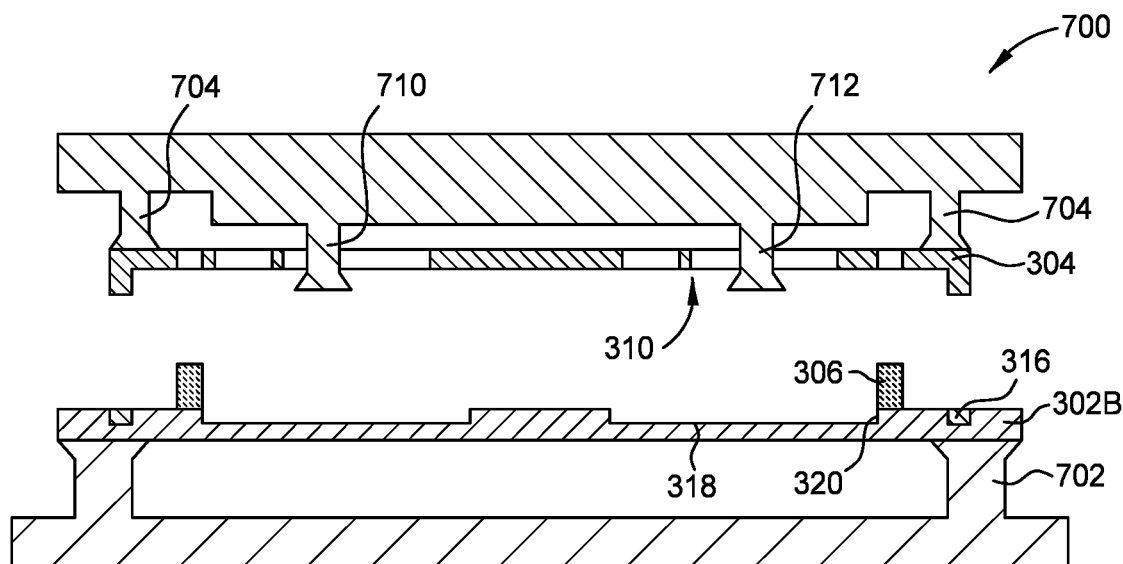

At operation 603, as shown in FIG. 7B, the lower vacuum chuck 702 is lifted. The lower vacuum chuck 702 is lifted such that the mask 304 is in contact with an upper vacuum chuck 704. At operation 604, power is applied to the upper vacuum chuck 704 to chuck the mask 304 to the upper vacuum chuck 704. At operation 605, as shown in FIG. 7C, the lower vacuum chuck 702 is lowered. The carrier 302B is chucked to the lower vacuum chuck 702 and the mask 304 is chucked to the upper vacuum chuck 704.

Figure 7D:
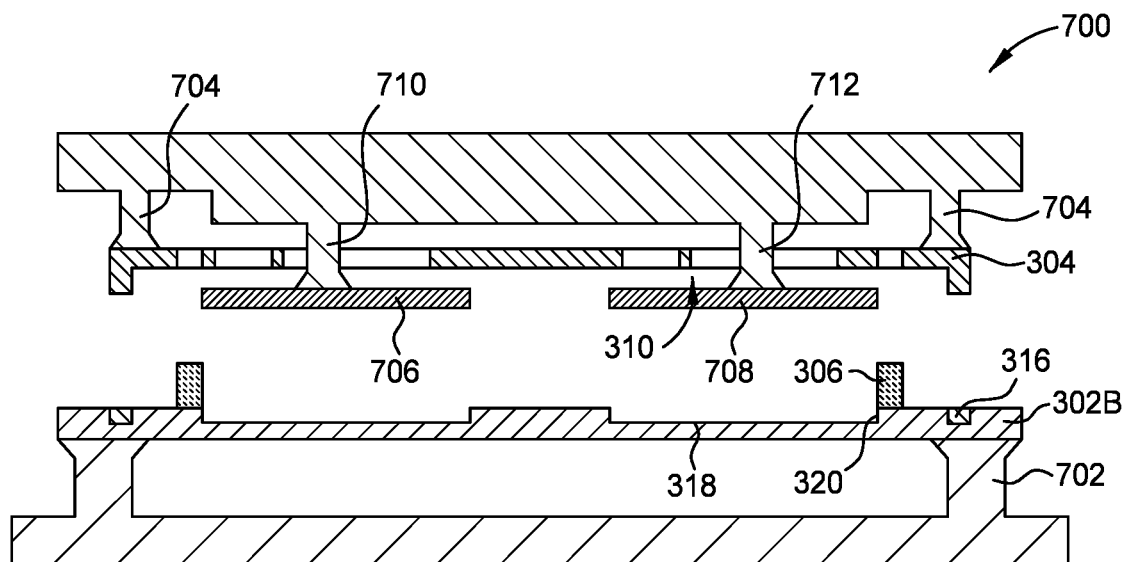

At operation 606, as shown in FIG. 7D, the actuator arms 509 place a first substrate 706 and a second substrate 708 of the one or more substrates 102 in contact with a first substrate chuck 710 and a second substrate chuck 712. Although only two substrates 102 of the one or more substrates 102 are shown in FIGS. 7A-7D, any number of substrates 102 can be included in the assembly of the carrier assembly 300A or 300B. For example, in one embodiment, which can be combined with other embodiments described herein, a third and a fourth vacuum chuck can chuck a third and a fourth substrate 102 at operation 604. Prior to operation 604, the first substrate 706 is removed from the substrate FOUP 502 by the actuator arms 509. The actuator arms 509 transfer the first substrate 706 to the aligner station 512. The aligner station 512 finds the center 514 of the first substrate 706 and aligns the first substrate 706 prior to entering the build chamber 700. The actuator arms 509 remove the first substrate 706 from the aligner station 512 and places the first substrate 706 in contact with the first substrate chuck 710. At operation 607, power is applied to the first substrate chuck 710 to chuck the first substrate 706 to the first substrate chuck 710. The second substrate 708 is removed from the substrate FOUP 502 by the actuator arms 509. The actuator arms 509 transfer the second substrate 708 to the aligner station 512. The aligner station 512 finds the center 514 of the second substrate 708 and aligns the second substrate 708 prior to entering the build chamber 700. The actuator arms 509 remove the second substrate 706 from the aligner station 512 and places the second substrate 706 in contact with the second substrate chuck 712. At operation 608, power is applied to the second substrate chuck 712 to chuck the second substrate 706 to the second substrate chuck 712.

Figure 7E:
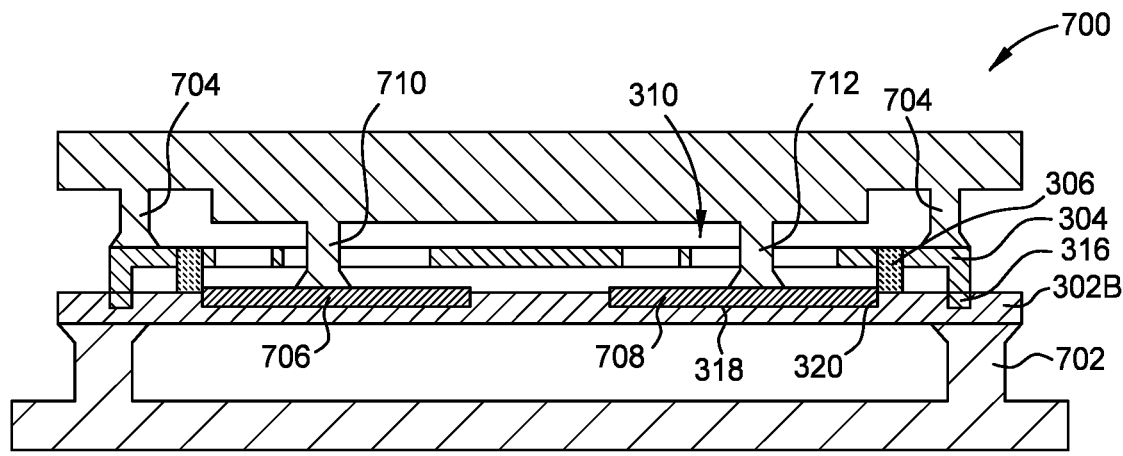

At operation 609, as shown in FIG. 7E, the lower vacuum chuck 702 is lifted. The lower vacuum chuck 702 is lifted such that the carrier 302B is in contact with the mask 304. At operation 610, the carrier 302B and the mask 304 magnetically clamp to retain the first substrate 706 and the second substrate 708 of the one or more substrates 102. At operation 611, power to the first substrate chuck 710, the second substrate chuck 712, and the upper vacuum chuck 704 is turned off to release the first substrate 706, the second substrate 708, and the mask 304.

Figure 7F:
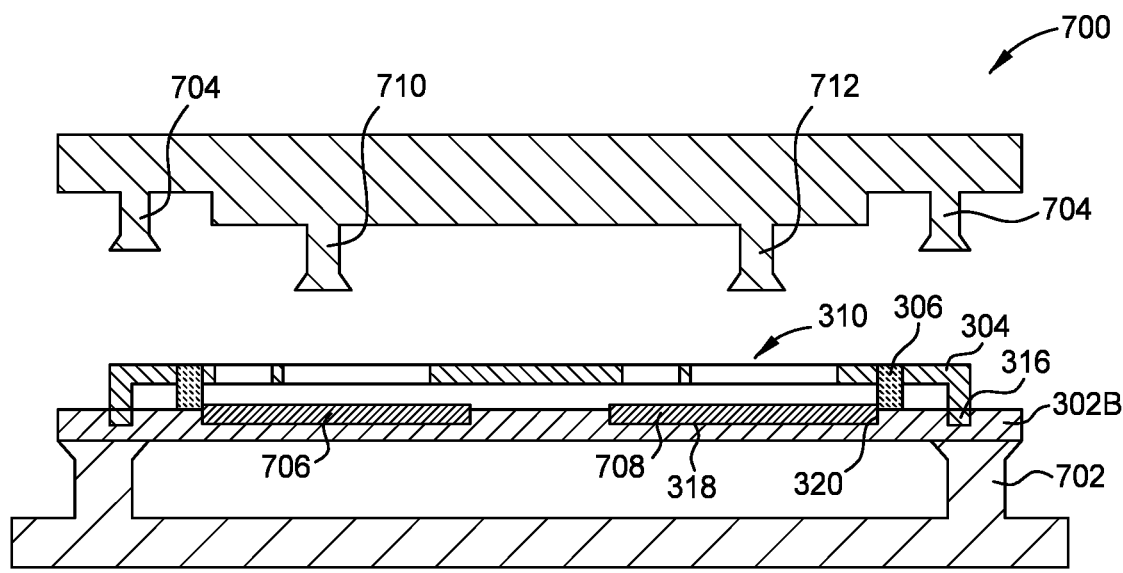

At operation 612, as shown in FIG. 7F, the lower vacuum chuck 702 is lowered. A carrier assembly 300B including the carrier 302B, the mask 304, the first substrate 706, and the second substrate 708 is lowered with the lower vacuum chuck. In one embodiment, which can be combined with other embodiments described herein, laser sensors (not shown) coupled to the build chamber 700 verify the alignment of the carrier assembly 300B. Power to the lower vacuum chuck 702 is turned off to release the carrier assembly 300B. At operation 613, the actuator arms 508 remove the carrier assembly 300B from the build chamber 700. The assembled carrier assembly is placed into the FOUP 501B. The method 600 is repeated until the desired number of the carrier assemblies 300B are assembled and placed in the FOUP 501B.

In one embodiment, which can be combined with other embodiments described herein, the one or more substrates 102 need to be processed on a front side surface and a backside surface. A flip device 503 allows the one or more substrates 102 to be flipped so that the one or more substrates 102 may be processed on the backside surface in subsequent processes. For example, in embodiments where the one or more substrates 102 are flipped after processing, the actuator arms 508 remove the carrier assembly 300B from the FOUP 501A. The actuator arms 508 transfer the carrier assembly 300B to the aligner station 512. The aligner station 512 finds the center 514 of the carrier assembly 300B and aligns the carrier assembly 300B prior to entering the build chamber 700. The actuator arms 508 remove the carrier assembly 300B from the aligner station 512 and places the carrier assembly on a lower vacuum chuck 702 in the build chamber 700. The lower vacuum chuck 702 is then lifted. The lower vacuum chuck 702 is lifted such that the mask 304 is in contact with an upper vacuum chuck 704. Power is applied to the upper vacuum chuck 704, the first substrate chuck 710 and the second substrate chuck 712. The mask 304 in contact with the upper vacuum chuck 704 is chucked. The first substrate 706 and the second substrate 708 of the one or more substrates 102 in contact with the first substrate chuck 710 and the second substrate chuck 712 are chucked. The lower vacuum chuck 702 is lowered. The carrier 302B is chucked to the lower vacuum chuck 702. The actuator arms 509 remove the one or more substrates 102 and place them in the flip device 503 to be flipped. The operation 604 is then performed to place the one or more substrates 102 in contact with a first substrate chuck 710 and a second substrate chuck 712. Prior to operation 604, the one or more substrates 102 are transferred from the flip device 503 to the aligner station 512 to be aligned. The operations 605-607 are performed to finish the assembly of the carrier assembly 300B including the one or more substrates 102 that have been flipped. The backside surface of the one or more substrates 102 is exposed in the carrier assembly 300B.

In another embodiment, which can be combined with other embodiments described herein, the carrier assembly 300B needs to be disassembled to remove the one or more substrates 102. The build station 515 is operable to disassemble the carrier assembly 300B. For example, in embodiments where the carrier assembly 300B is disassembled after processing, the actuator arms 508 remove the carrier assembly 300B from the FOUP 501A. The actuator arms 508 transfer the carrier assembly 300B to the aligner station 512. The aligner station 512 finds the center 514 of the carrier assembly 300B and aligns the carrier assembly 300B prior to entering the build chamber 700. The actuator arms 508 remove the carrier assembly 300B from the aligner station 512 and place the carrier assembly on a lower vacuum chuck 702 in the build chamber 700. The lower vacuum chuck 702 is then lifted. The lower vacuum chuck 702 is lifted such that the mask 304 is in contact with an upper vacuum chuck 704. Power is applied to the upper vacuum chuck 704, the first substrate chuck 710 and the second substrate chuck 712. The mask 304 in contact with the upper vacuum chuck 704 is chucked. The first substrate 706 and the second substrate 708 of the one or more substrates 102 in contact with the first substrate chuck 710 and the second substrate chuck 712 are chucked. The lower vacuum chuck 702 is lowered. The carrier 302B is chucked to the lower vacuum chuck 702. The actuator arms 509 remove the one or more substrates 102 and place them in the substrate FOUP 502. The lower vacuum chuck 702 is then lifted to magnetically clamp with the mask 304 with the carrier 302B. Power is turned off from the upper vacuum chuck 704 and the lower vacuum chuck 702 is lowered. Power is turned off to the lower vacuum chuck 702 such that the mask 304 and the carrier 302B are no longer chucked and can be removed by the actuator arms 508. The actuator arms 508 transfer the mask 304 and the carrier 302B to the FOUP 501B.

In yet another embodiment, the method disclosed herein can be completed without the mask 304. In embodiments where the mask 304 is not required, the upper vacuum chuck 704 is not utilized and the one or more substrates 102 are placed in the carrier 302B without the mask 304.

In summation, embodiments described herein provide for a carrier assembly that includes a carrier, one or more substrates, and a mask. The carrier is magnetically coupled to the mask to retain the one or more substrates. The carrier assembly is used for supporting and transporting the one or more substrates during processing. The carrier assembly is also used for masking the one or more substrates during PVD processing. Methods for assembling the carrier assembly in a build chamber are described herein.

While the foregoing is directed to embodiments of the present disclosure, other and further embodiments of the disclosure may be devised without departing from the basic scope thereof, and the scope thereof is determined by the claims that follow.

What is claimed is:

1. A carrier assembly, comprising:
    a mask, the mask including a pattern of openings disposed through the mask, the mask including pinholes;
    a carrier, the carrier including:
        a magnet disposed in the carrier, the magnet magnetically coupled to the mask;
        a plurality of lips, a distance between adjacent lips of the plurality of lips corresponding to a substrate to be disposed on the adjacent lips of the plurality of lips;
        a plurality of pins disposed through the plurality of lips, the plurality of pins operable to surround the substrate disposed on the adjacent lips of the plurality of lips; and
        alignment pins disposed in the carrier and disposed through the pinholes in the mask, the alignment pins disposed through the plurality of lips.

2. The carrier assembly of claim 1, wherein the mask includes a pattern of openings.

3. The carrier assembly of claim 2, wherein the pattern of openings correspond to a first region, a second region, and a third region of a waveguide combiner.

4. The carrier assembly of claim 1, wherein the mask is a clamp ring.

5. The carrier assembly of claim 1, wherein the mask includes a stainless steel material or a non-ferrous material.

6. The carrier assembly of claim 1, wherein the carrier assembly is operable to be scanned vertically during processing.

7. The carrier assembly of claim 1, wherein the carrier includes a silicon material.

* * * * *